United States Patent
Mylly

(10) Patent No.: US 7,330,944 B2
(45) Date of Patent: Feb. 12, 2008

(54) METHOD FOR STORING DATA IN A MEMORY, A SYSTEM, AN ELECTRONIC DEVICE AND A MEMORY CARD

(75) Inventor: Kimmo Mylly, Julkujärvi (FI)

(73) Assignee: Nokia Siemens Networks Oy, Espoo (FI)

(*) Notice: Subject to any disclaimer, the term of this patent is extended or adjusted under 35 U.S.C. 154(b) by 500 days.

(21) Appl. No.: 10/813,897

(22) Filed: Mar. 30, 2004

(65) Prior Publication Data
US 2004/0260969 A1    Dec. 23, 2004

(30) Foreign Application Priority Data
Mar. 31, 2003    (FI) ................. 20035041

(51) Int. Cl.
*G06F 12/00*    (2006.01)
(52) U.S. Cl. .......... 711/156; 711/152; 711/154; 714/5
(58) Field of Classification Search ............ None
See application file for complete search history.

(56) References Cited

U.S. PATENT DOCUMENTS

| | | | | |
|---|---|---|---|---|
| 5,438,536 A | | 8/1995 | Salzman ............... 365/52 |
| 6,484,270 B1 * | | 11/2002 | Odani .................. 714/6 |
| 6,549,475 B2 * | | 4/2003 | Nakazawa et al. ..... 365/189.12 |
| 6,829,178 B2 * | | 12/2004 | Koyama et al. ....... 365/189.07 |
| 6,959,365 B2 * | | 10/2005 | Ootani et al. ............ 711/152 |
| 2003/0110361 A1 * | | 6/2003 | Kanehira et al. ........ 711/154 |
| 2004/0098545 A1 * | | 5/2004 | Pline et al. ............. 711/154 |

FOREIGN PATENT DOCUMENTS

DE    300496 A7    6/1992

OTHER PUBLICATIONS

Translation of the abstract attached.

* cited by examiner

*Primary Examiner*—Jasmine Song
(74) *Attorney, Agent, or Firm*—Ware, Fressola, Van Der Sluys & Adolphson

(57) ABSTRACT

The invention relates to a method for performing a memory processing function to a block memory (2), wherein there are memory cells (18), where data can be stored, and a connection bus (5), wherein there is at least a ready/busy line (5h). The ready/busy line (5h) can be set at least to a ready status and a busy status. In the method, setting the status of said ready/busy line (5h) to said busy status is performed at the beginning of the processing function, and the detection of processing errors is performed. The end of processing function is indicated by setting said ready/busy line (5h) to said ready status. After detecting a processing error, the status of said ready/busy line (5h) is changed back to said busy status if an processing error is detected. The invention also relates to a system, an electronic device (1) and a block memory (2), in which the method is applied.

22 Claims, 4 Drawing Sheets

METHOD FOR STORING DATA IN A MEMORY, A SYSTEM, AN ELECTRONIC DEVICE AND A MEMORY CARD

CROSS-REFERENCE TO RELATED APPLICATIONS

This application claims priority under 35 USC §119 to Finnish Patent Application No. 20035041 filed on Mar. 31, 2003.

FIELD OF THE INVENTION

The present invention relates to a method for performing a memory processing function in a block memory, wherein there are memory cells, where data can be stored, and a connection bus, wherein there is at least a ready/busy line, which can be set at least to a ready status and to a busy status, and in which method setting the status of said ready/busy line to said busy status is performed in the beginning of the processing function, and detection of processing errors is performed, and the end of processing function is indicated by setting said ready/busy line into said ready status. In addition, the present invention relates to a system, which comprises an electronic device, wherein there is block memory, where there are memory cells, wherein data is arranged to be stored, and a connection bus, wherein there is at least a ready/busy line, which is arranged to be set at least to a ready status and to a busy status, and which block memory comprises means for setting the status of said ready/busy line to said busy status in the beginning of the processing function of the block memory, a comparator for detecting processing errors, and the end of processing function is arranged to be indicated by setting said ready/busy line into said ready status. In addition, the present invention relates to an electronic device, which comprises block memory, wherein there are memory cells, where data is arranged to be stored, and a connection bus, wherein there is at least a ready/busy line, which is arranged to be set at least to a ready status and to an busy status, and which block memory comprises means for setting the status of said ready/busy line to said busy status in the beginning of the processing function of the block memory, a comparator for detecting processing errors, and the end of processing function is arranged to be indicated by setting said ready/busy line into said ready status. The invention also relates to a block memory, wherein there are memory cells, where data is arranged to be stored, and a connection bus, wherein there is at least a ready/busy line, which is arranged to be set at least to a ready status and to a busy status, and which block memory comprises means for setting the status of said ready/busy line to said busy status in the beginning of the processing function of the block memory, a comparator for detecting processing errors, and the end of processing function is arranged to be indicated by setting said ready/busy line into said ready status.

BACKGROUND OF THE INVENTION

There are known memories, where data programming into the memory and reading the stored data is performed in larger units instead of bytes/words. For example, NAND memories and NOR memories consist of memory cell matrices. Each line of this type of a matrix forms one page. Larger assemblies (blocks) can be gathered from these lines, in which case a part of memory operations is page-specific and a part relates to one or more blocks. The size of a page is, for example, in a 64-megabyte NAND memory 528 bytes, from which 16 bytes are so called Spare bytes, i.e. the number of usable bytes on one page is 512. In this example memory, one block consists of 16 pages, but other block sizes can also be used. In this description, such memories are also called block memories.

NAND memories do not include an address bus, but communicating the addresses to the memory is performed via a data bus. The width of the data bus is typically 8 bits. Typically, in NAND memories the programming of data into the memory and reading the data from the memory is performed one page at a time, but, for example, erasing the memory (setting the memory cell to a certain value, either to a 0-status or to a 1-status) is performed by blocks. Changing the data of an individual byte requires rewriting the data of that entire page where the byte to be changed is located. The use of this type of memory is somewhat more complicated than the use of a conventional Random Access Memory (RAM). When data is written to this type of memory, the operation is typically such, that the processor of a device sends the data to be stored one page at a time to the memory controller, which forwards the data to the memory. The memory is first informed the address of the programming location, typically the base address of the page. This takes place in such a manner, that a command referring to this is set to the I/O bus, after which a pulse is set to the command line, in which case the memory reads the command in the I/O bus. In addition to the command, also the address of the programming location is provided this way. In the next step, sending the data from the pages to be saved from the memory controller to the memory is started, typically bit by bit. There is cache in the memory, where the page to be stored into the memory is written.

After storing the data, the validity of programming is checked. In some memories according to the prior art this is performed automatically after each stored page by comparing the stored data to the data that was to be stored. The status of the comparison is stored into a status register inside the memory. The status of this status register can be checked after the programming by sending a command to read the status register to the memory, which the memory answers with the contents of the status register. Thus, the memory controller can, on the basis of this status data, conclude whether the data was stored correctly. In order to send the status data of programming, the memory controller communicates, for example, an interrupt request to the processor, which on the basis of this reads the status data sent by the memory controller. This type of an arrangement has e.g. the disadvantage that interrupts come to the processor after the processing of each page, even though the data would be stored in the memory correctly. The amount of data to be stored can be quite large, in which case there are many interrupts, which slows down the operation of the processor.

There are several memory structures as described above, which are based on different techniques, such as NAND, XOR, etc. However, what these memories have in common is that the data remains in them after the operating voltages are removed, i.e. they are so-called non-volatile memories. In addition, the programming of data to this type of non-volatile memory is slower than dynamic and static random access memories.

Non-volatile memories can be arranged as memory cards, which can be attached to an electronic device in a releasable manner. This type of memory card can thus be moved from one device to another, which makes it possible to e.g. transfer data between devices. For example, in a digital camera the images can be stored into a memory card. After programming the memory card can be removed from the digital camera and placed, for example, in a computer or a mobile communication device. Thus the images can be read from the memory card into the memory of this other device. Other memory card applications include the programming of program files, videos, music, text files, etc.

Even though it has been presented above that a memory controller has been arranged for memory processing, via which the transmission of data between the processor and memory is performed, it is clear that the processor can control the memory directly as well. Thus, however, the load in the processor caused by the memory processing is even greater than when using a memory controller.

SUMMARY OF THE INVENTION

It is an aim of the present invention to provide an improved method and a system for storing data in a memory, as well as a memory and a device applying the method. The invention is based on the idea that information on the programming is transmitted to the processor only if an error has occurred in the programming. This data transmission can be arranged advantageously with an interrupt, which can be transmitted along some line existing on the interface of the memory or a line formed for this purpose. To be more exact, the method according to the present invention is primarily characterized in that if a processing error is detected, the status of said line, for instance a ready/busy line which can be set to a ready status or a busy status, is changed from said ready status back into said busy status. The system according to the present invention is primarily characterized in that after detecting a processing error the status of said ready/busy line is arranged to be changed back into said busy status. The electronic device according to the present invention is primarily characterized in that after detecting a processing error the status of said ready/busy line is arranged to be changed back into said busy status. The block memory according to the present invention is primarily characterized in that after detecting a processing error the status of said ready/busy line is arranged to be changed back into said busy status.

In a system and an electronic device according to an advantageous embodiment of the invention, the memory controller increases the memory addresses if data is stored consecutively to more than one page.

The present invention shows remarkable advantages over solutions of prior art. With the method according to the present invention, it is possible to decrease the load of the processor, because no interrupt is caused to the processor in situations where programming is performed faultlessly. In addition, the need to transmit commands between the memory controller and the memory is smaller than when using memory structures according to prior art. In addition, with the method according to an advantageous embodiment of the invention is reached the advantage that the processor does not have to take care of increasing the memory addresses, in which case the execution time of the processor is freed for performing other tasks.

DESCRIPTION OF THE DRAWINGS

In the following, the invention will be described in more detail with reference to the appended drawings, in which.

DETAILED DESCRIPTION OF THE INVENTION

Figure 1:
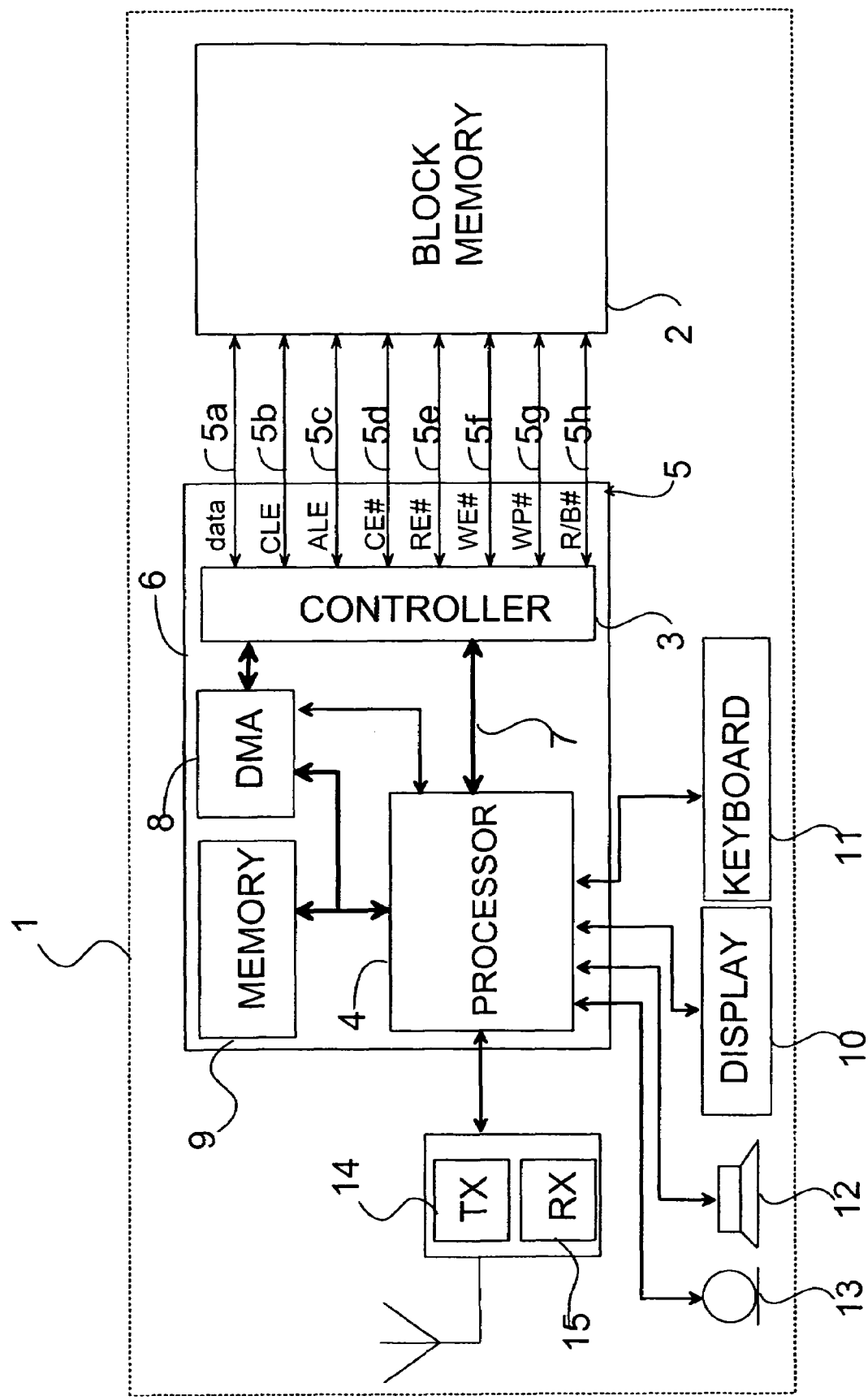
FIG. 1 shows an electronic device according to a preferred embodiment of the invention in a simplified block diagram.

In the following description, the method according to an advantageous embodiment of the invention will be exemplified with an electronic device 1 shown in FIG. 1, wherein there is, among other things, block memory 2, such as NAND memory or NOR memory. In order to control the block memory 2, a memory controller 3 is advantageously arranged in the electronic device 1. It is, however, evident that the memory controller 3 is not necessary in all applications, but, for example, a processor 4 can be used in memory control operations. In this embodiment, the memory controller 3 and the processor 4 are arranged into the same Application Specific Integrated Circuit (ASIC) 6, but these can also be separate circuits.

A connection bus 5 between the block memory 2 and the memory controller 3 comprises advantageously a data bus 5a (data) composed of at least one data line, as well as control lines 5b to 5h. By means of these control lines the performance of memory functions can be controlled. In an electronic device according to this advantageous embodiment, the control lines comprise a Command Latch Enable line 5b (CLE), an Address Latch Enable line 5c (ALE), a Chip Enable line 5d (CE), a Read Enable line 5e (RE), a Write Enable line 5f (WE), a Write Protect line 5g (WP), and a Ready/Busy line 5h (R/B). In FIG. 1 the mark # in connection with some control lines means that the line in question is a so-called "active when down" line, i.e. active in a logic 0-status. However, it will be evident that the invention is not limited solely to alternatives according to FIG. 1, but lines that are active when up (in logic 1-status) can be used.

For transmission of signals, there is a connection bus 7 between the processor 4 and the memory controller 3 as well. Among other things, addresses, data and control data, such as interrupts, are transmitted via this connection bus between the processor 4 and the memory controller 3.

Figure 2A:
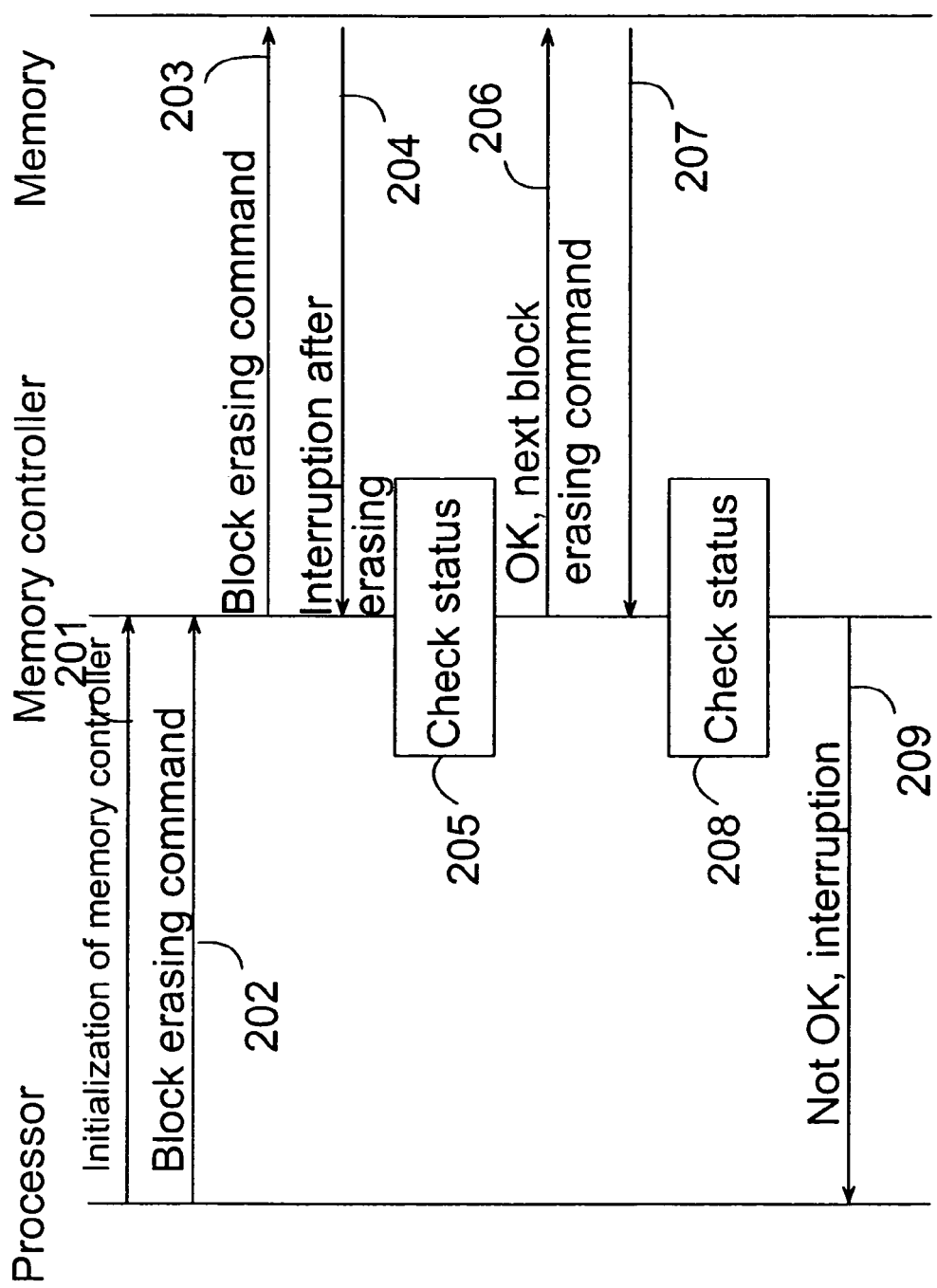
FIG. 2a shows the signalling between a processor, a memory controller and a memory, in connection with eras-ing the memory to be used, in the method according to a preferred embodiment of the invention.

In the method according to a preferred embodiment of the invention, control of the block memory 2 is advantageously performed in the following manner. First, the block-by-block emptying of the block memory 2 is described. This is presented in FIG. 2a as a signalling chart. Processor 4 sends function parameters affecting its operating state (arrow 201 in the chart in FIG. 2a) to the memory controller 3. After this, the processor 4 sends a memory block erasing command to the memory controller 3, and reports the base address, serial number, or corresponding information on the block to be erased, which identifies the block to be erased in the block memory 2 (arrow 202). In addition, the memory controller 3 is informed preferably of the number of blocks or the length of the memory area to be erased, if there are more than one blocks to be erased. After this, the memory controller 3 sets, if necessary, the chip enable line 5d to a status, where the connection bus of the block memory is active. This status is, for example, the logic 0-status. When the block memory 2 is activated, the memory controller 3 first examines whether the block memory 2 is ready, for example, to receive commands, or is the block memory 2 in the middle of some function. If the block memory 2 is performing, for example, programming of data or erasing the memory, the block memory 2 usually cannot receive new commands. This can be determined by examining the status of the ready/busy line 5h. The status can be either ready or busy. Let us assume here that in the ready status the ready/busy line 5h is in a logic 1-status, and correspondingly in a busy status the ready/busy line is in a logic 0-status.

When the ready/busy line 5h indicates that the block memory 2 is ready to receive commands, the memory controller 3 sets a block erasing command (arrow 203) to the data bus 5a of the connection bus 5. After this, a pulse is advantageously sent to the command latch enable line 5b, in which case an inner controller 16 of the block memory 2 (see FIG. 3) reads the command from the data bus 5a on the edge of the pulse. Depending on the application, this edge can either be a rising edge or a downward edge. After this, the memory controller 3 sets an address data of the block to be erased, or a part of it, to the data bus 5a and after the address data has settled on the data bus 5a, the memory controller 3 forms a pulse to the address latch enable line 5c. Thus, the controller 16 of the block memory reads the address data from the data bus 5a. With the typical 8-bit bus used in this example, it is not possible to address the memory space of the entire block memory 2, in which case the address must be given in several parts. Thus, the memory controller 3 repeats the above described address transmission as many times as necessary, typically two or three times, in which case the block memory 2 uses all the transmitted address data to identify the block to be erased. When the entire address has been transmitted to the block memory 2, the block memory 2 (advantageously the controller 16) changes the status of the ready/busy line 5h, i.e. sets it to the busy status, for example to a logic 0-status. After this, the block memory 2 begins erasing the memory area, i.e. starts to set all the bits on this memory area to a certain status, advantageously to a logic 1-status. When the ready/busy line 5h is in the busy status, the block memory 2 is performing the set function, i.e. in this case erasing the memory.

In connection with erasing the memory area, it is checked in the block memory 2 whether erasing all the bits was successful or not. If some bit has not settled into the desired status, the status data is saved in the block memory 2. After performing the erasing and comparison function, the status of the ready/busy line 5h is reset to the ready status, for example to the logic 1-status (arrow 204). This change in the status of the ready/busy line causes an interrupt in the memory controller 3, in which case the memory controller moves to perform a corresponding interrupt service program. If an error occurred in erasing, error data indicative of this fact is transmitted to the memory controller advantageously in the following manner. In the block memory 2, the status of the ready/busy line 5h is changed back to the busy status. Now the memory controller 3 reads the status of the ready/busy line 5h (block 205), and if it is in said busy status, the memory controller 3 can conclude an error has occurred. If necessary, the processor 4 can be informed of this error, for example by an interrupt. However, if the status of the ready/busy line is in the ready status, the memory controller 3 can conclude that the function has succeeded and the next command can be transmitted to the block memory 2 (arrow 206). With this arrangement, the memory controller 3 does not have to separately read the status data from the block memory 2, but the function can continue with, for example, erasing the next block, which is depicted by arrows 206 and 207, as well as block 208 in FIG. 2a. In this example situation, the memory controller 3 has detected during the checking 208 of the status data that an error has been detected to have occurred during block erasing in the block memory 2. Thus, the memory controller 3 advantageously forms an interrupt (arrow 209) to processor 4, which, on the basis of this interrupt, can take the necessary procedures, such as try erasing the block again. If erasing the block does not succeed despite several erasing attempts, it can be assumed that in the block in question there are one or more faulty memory cells. Thus, the memory block in question can be marked as unfit for use and no memory procedures are aimed at it after that. It is, however, clear that in some applications the entire block is not necessarily unfit for use, but instead of the entire block it is possible to mark a page where the faulty memory cell is located as unfit for use. In addition, it is possible to arrange an error correction function in connection with the block memories, in which case the faulty memory cell can be replaced with another memory cell, or the effect of a faulty memory cell can be attempted to be eliminated with an error correction algorithm or a corresponding method known as such.

Figure 2B:
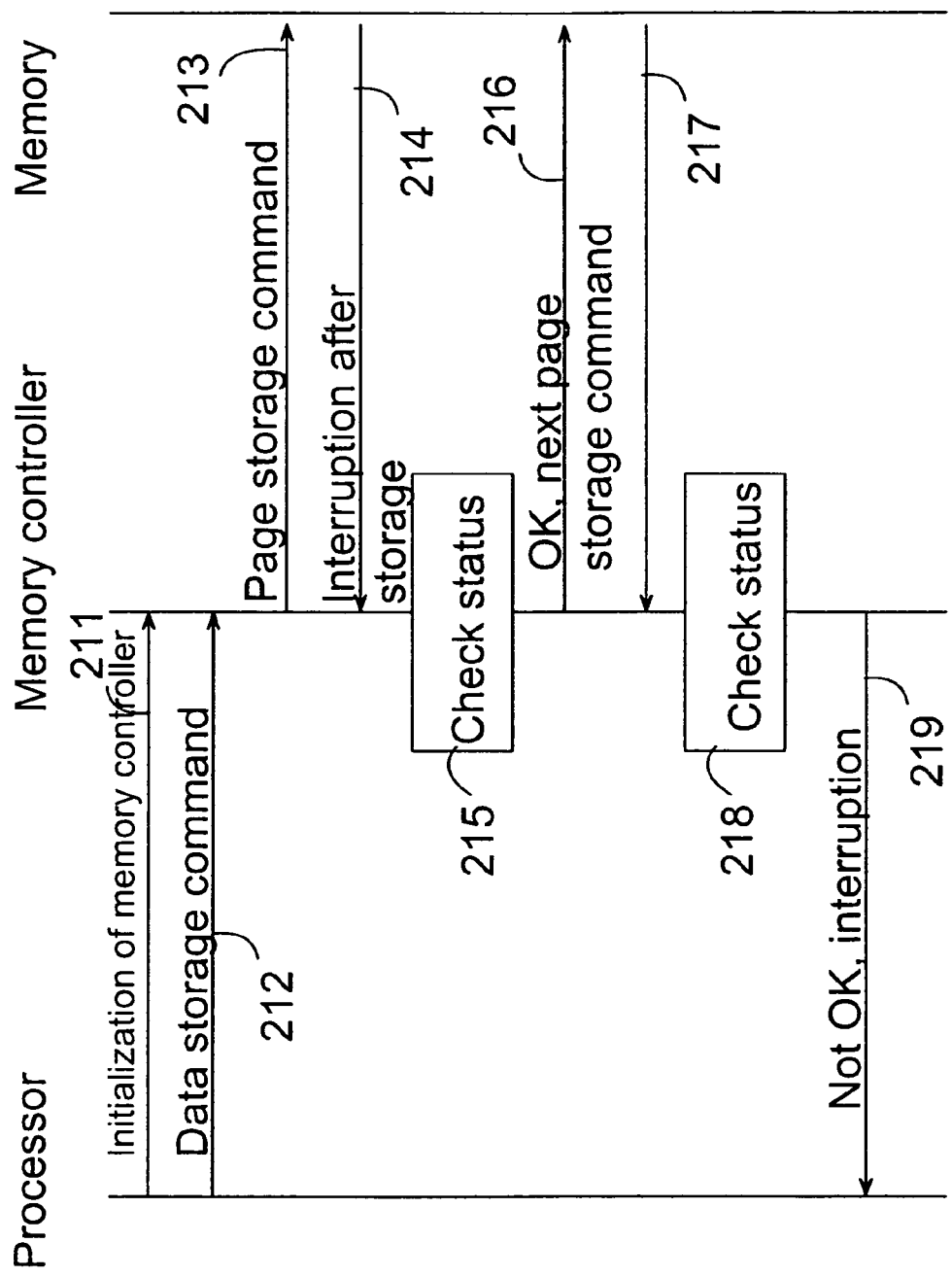
FIG. 2b shows the signalling between a processor, a memory controller and a memory, in connection with programming to the memory to be used, in the method according to a preferred embodiment of the invention.

Next, storing data to the block memory 2 will be described. This is presented in FIG. 2b as a signalling chart. The processor 4 sends function parameters affecting its operating state (arrow 211 in the chart in FIG. 2b) to the memory controller 3. After this, the processor 4 sends the memory controller 3 the programming command of the memory page, the data to be stored, as well as the address where the data is to be stored in the block memory 2 (arrow 212). This programming address is preferably a page address. As was already stated earlier, an individual byte cannot be stored as such in the block memories, but the data of that entire page where the change is taking place is to be stored. If the data area is larger than one page, the processor 4 informs the memory controller advantageously also, for example, the number of the bytes, pages, or blocks to be stored, or the end address of the area to be stored. On the other hand, if the processor 4 sends all the data to be stored to the memory controller 3, the memory controller can, on the basis of the amount of data it has received, calculate the amount of data to be stored, as well as how many pages there are of the data to be stored.

After this, the memory controller 3 performs the corresponding procedures to the block memory 2, as those presented in the erasing example above, i.e. if necessary, sets the status of the chip enable line 5d and examines the status of the ready/busy line 5h. When the ready/busy line 5h indicates that the block memory 2 is ready to receive commands, the memory controller 3 sets a data programming command (arrow 213) to the data bus 5a of the connection bus 5. After this, advantageously a pulse is sent to the command latch enable line 5b, in which case the inner controller 16 of the block memory 2 reads the command from the data bus 5a on the edge of the pulse. Next, the memory controller 3 sets an address data to the data bus 5a or a part of it, and after the address data has settled on the data bus 5a, the memory controller 3 forms a pulse to the address latch enable line 5c. Thus the controller of the block memory reads the address data from the data bus 5a. After the entire address has been transmitted to the block memory 2, the block memory 2 changes the status of the ready/busy line 5h, i.e. sets it to busy status. After this, the programming of data into the memory cells is started in the block memory 2. When the status of the ready/busy line 5h is in the busy status, the block memory 2 is performing the set function, i.e. in this case saving the data into the memory.

Also, in connection with storing data, it is checked in the block memory 2 whether setting all the bits to the desired status was successful or not. If some bit has not settled into the desired status, the status data is saved in block memory 2. After performing the programming and comparison function, the status of the ready/busy line 5$h$ is reset to the ready status (arrow 214). This change in the status of the ready/busy line causes an interrupt at the memory controller 3, in which case the memory controller moves to perform a corresponding interrupt service program. If an error occurs in storing, error information of this is transmitted to the memory controller similarly as in connection with the erasing, advantageously in the following manner. In the block memory 2, the status of the ready/busy line 5$h$ is changed back to the busy status. Now the memory controller 3 reads the status of the ready/busy line 5$h$ (block 215) and if it is in said busy status, the memory controller 3 can conclude an error has occurred. However, if the status of the ready/busy line is in the ready status, the memory controller 3 can conclude that the function has succeeded and the next command can be transmitted to the block memory 2. If the data is stored correctly, the data programming can be continued, if necessary. Thus the memory controller 3 sends a programming command, advantageously the address of the next page, as well as the data to be stored in the page in question (arrow 216). In the method according to an advantageous embodiment of the invention, the memory controller 3 increases the addresses, in which case the processor 4 does not have to take care of it. After the data of a page has been stored in the block memory 2, once again an interrupt is formed to the memory controller 3 (arrow 217), which after this checks the status of the ready/busy line (block 218). If an programming error has been detected, the memory controller 3 advantageously forms an interrupt (arrow 219) to processor 4, which on the basis of this interrupt can take the necessary procedures, such as try storing the data again.

In some memories, data can also be copied inside the memory from one block to some other block without having to transfer the copied data outside the memory. This function is, in some connections, referred to as the Copy-Back technique. In order to perform the copying function advantageously, the processor 4 sends a copy command of the memory page, information on the location of the data to be copied in the memory (for example the base address), as well as the address where the data is meant to be copied in the block memory 2 (for example a side address of the page in question) to the memory controller 3. If the data area to be copied is larger than one page, the processor 4 informs the memory controller advantageously also, for example, the number of the bytes, pages, or blocks to be copied, or the end address of the area to be copied. After receiving the necessary data the memory controller 3 transmits the data to the block memory 3, wherein the copying can be started. In transmitting commands, advantageously the functional principles described above in connection with storing are followed. When starting the data copying, the block memory 3 sets the status of the ready/busy line 5$h$ to the busy status. After this, the copying of data is started in the block memory 2. When the ready/busy line 5$h$ is in the busy status, the block memory 2 is performing data copying in the memory. In connection with copying the data, it is checked in the block memory 2 whether copying was successful or not. If an error has occurred in copying, the error data is stored in the block memory 2. After performing the copying and comparison function, the status of the ready/busy line 5$h$ is reset to the ready status. If an error has occurred in copying, the status of the ready/busy line 5$h$ is changed back into busy status, in which case the memory controller 3 and/or the processor 4 can detect that an error has occurred.

The invention can also be applied in connection with reading data. Even then the data and command/commands required for reading are transmitted to the block memory 2, after which reading the data from the block memory 2 is started. If in connection with reading the block memory 2 detects an error, notification of this is performed, by applying the above-presented principles, by means of status changes. Error detection can be based on, for example, the inner monitoring characteristics possibly in the block memory 2, with which it is possible to examine the working order of the cells.

Figure 3:
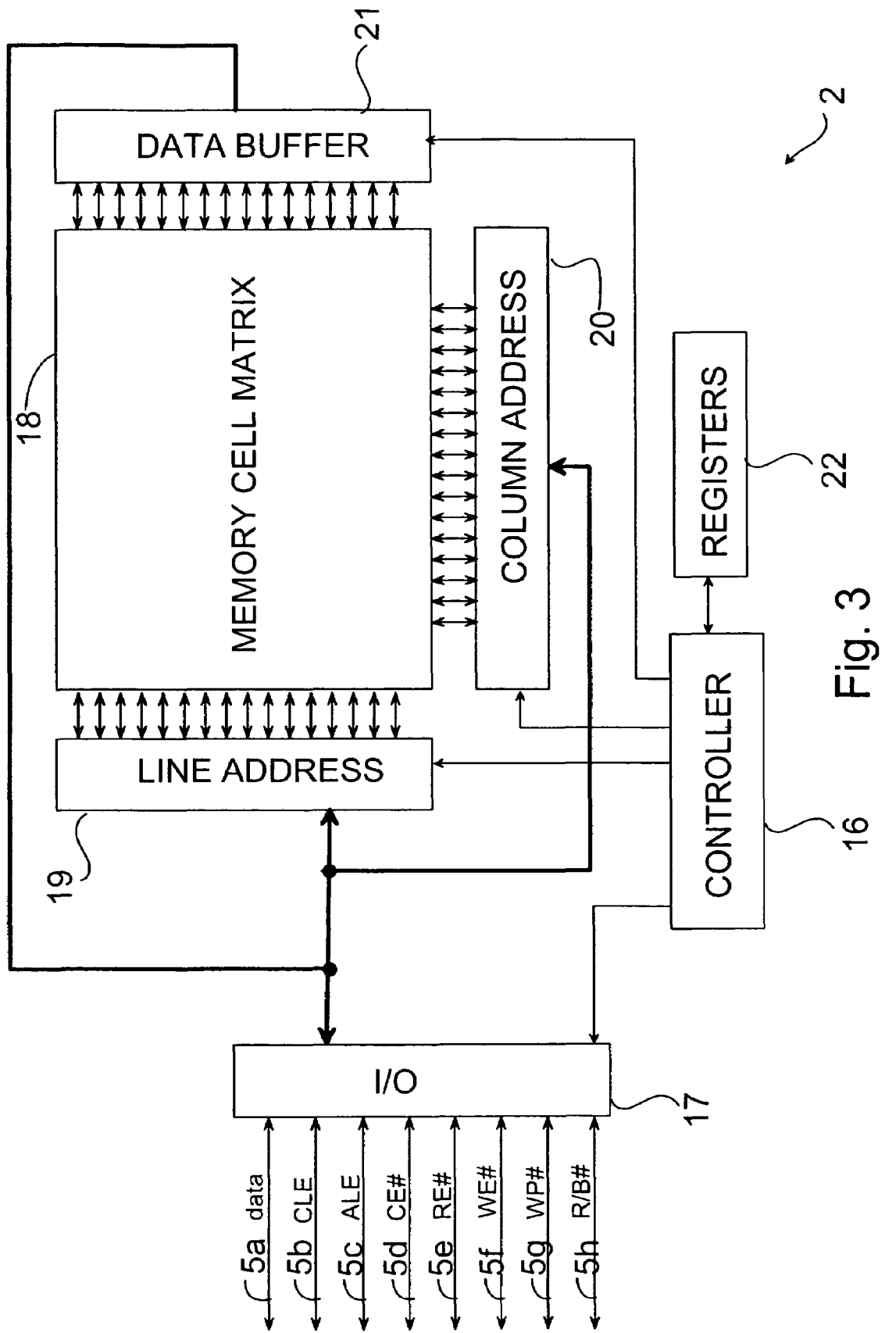
FIG. 3 shows a block memory according to a preferred embodiment of the invention in a simplified block diagram.

FIG. 3 shows, in a simplified manner, the structure of the block memory 2 according to an advantageous embodiment of the invention. The block memory comprises a controller 16, which mostly performs the control of the above-described functions, such as indication of status data, data comparison, controlling the erasing/storing in the block memory 2, etc. In addition, there is an I/O block 17 in the block memory 2 for connecting the block memory 2 to the connection bus 5, a memory cell matrix 18, line and column address buffers 19, 20, a data buffer 21, as well as registers 22.

In the electronic device according to FIG. 1, there is also a DMA block 8 (Direct Memory Access). By means of this DMA block 8 it is possible to perform data transmission between the memory 9 of the electronic device and the memory controller 3 without the processor 4 having to take part in the data transmission. Thus, the processor 4 can perform other tasks during data transmission. The present invention can also be applied in such a manner that the processor 4 starts the data transmission, for example, from the memory 9 to the block memory 2 by applying the principles presented above. The memory controller 3 takes care of searching the data from the memory 9 by means of the DMA block 8, of storing the data in the block memory, and of confirming the accuracy of the stored data. In an error situation the memory controller 3 can, for example, with an interrupt inform the processor 4 of an error, in which case the processor 4 can start the procedures caused by the error. On the other hand, the invention can also be applied in such a manner that the memory controller 3 first tries to remove the inaccurately stored data for example by trying the storing again, and if that does not succeed, the memory controller 3 notifies the processor 4 of the error.

Even though the invention is described above in an electronic device, where the memory controller 3 and possibly also the DMA block 8 is used, it is clear that the invention can be applied also without the memory controller 3 and the DMA block 8. If the memory controller 3 is not used, the block memory 2 can be connected to, for example, the bus of the processor 4. Thus, the procedures performed above by the memory controller 3 are performed in the processor 4. Also in this case it is possible to decrease the load of processor 4 with the present invention because, among other things, the status data does not have to be separately read from the block memory 2, but it can be determined by examining the status of the ready/busy line 5$h$ of the block memory.

The above mentioned ready/busy line 5$h$ does not necessarily have to be used as the ready/busy line of the block memory 2, but instead of it some other line of the connection bus 5 can be used, such as some data line of data bus 5$a$, or it is possible to arrange a specific line for this purpose.

It should be noted here that instead of interrupt it is possible to use another method as well, with which the operating state of the block memory can be monitored during data programming and erasing. Thus, for example, the memory controller 3 reads the status of the ready/busy line 5h at intervals and when the memory controller detects a status change from the busy status to the ready status, it is possible to conclude from this that the block memory 2 has finished the function that was started with the previous command. After this, the memory controller 3 can monitor if the block memory 3 changes the status of this ready/busy line relatively quickly back to the busy status, which, thus, is a sign that an erasing/storing error is detected in block memory 2.

After an error situation, the block memory 2 sets the status of the ready/busy line back to the ready status advantageously in that stage when the next operation is directed at the block memory at the latest. The block memory can detect this from the change of status of some control line, such as the status change in the chip select line 5d.

In the electronic device 1 according to FIG. 1 there is also a user interface, wherein there is e.g. a display 10, a keyboard 11, an earpiece 12, and a microphone 13. In addition, in the electronic device 1 there is also a transmitter 14 and a receiver 15 for performing mobile communication functions.

The invention can also be applied in connection with memory cards (not shown). This type of memory cards can be connected by means of a card interface arranged to the electronic device 1. Thus, the transmission of commands and signals as presented above is performed via the card interface. Block memory applying the method according to the invention is advantageously arranged to the memory card.

It will be evident that the present invention is not limited solely to the above-presented embodiments but it can be modified within the scope of the appended claims.

The invention claimed is:

1. A method for performing a processing function in a block memory, wherein said block memory comprises memory cells for storing data and a connection bus comprising at least a ready/busy line, which can be set at least to a ready status and to a busy status, said method comprising setting the status of said ready/busy line to said busy status in a beginning of the processing function,
performing detection of processing errors,
indicating an end of the processing function by setting said ready/busy line to said ready status, and
changing the status of said ready/busy line back to said busy status if a processing error is detected.

2. The method according to claim 1, wherein said processing function is erasing the block memory, and performing detection of processing errors comprises performing a comparison of an erased memory cell with the data meant for the status of the erased memory cell in connection with erasing, and wherein
if an erasing error is detected in the comparison, the status of said ready/busy line is changed back to said busy status.

3. The method according to claim 1, wherein said processing function is storing data to the block memory, and performing detection of processing errors comprises performing a comparison of stored data with data meant to be stored in connection with storing the data, and
wherein if a storing error is detected in the comparison, the status of said ready/busy line is changed back to said busy status.

4. The method according to claim 1, wherein said processing function is copying data in the block memory from one location to some other location, and performing detection of processing errors comprises performing a comparison of copied data with data meant to be copied in connection with copying the data, and
wherein if a copying error is detected in the comparison, the status of said ready/busy line is changed back to said busy status.

5. The method according to claim 1, wherein said processing function is reading data from the block memory, and performing detection of processing errors comprises performing examining status of a memory cell being read in connection with reading data, and
wherein if a memory cell error is detected in the examination, the status of said ready/busy line is changed back to said busy status.

6. The method according to claim 1, comprising starting the processing function by sending a command to the block memory, and
setting the status of said ready/busy line to the busy status in a stage when a function according to the command is started in the block memory.

7. The method according to claim 1, wherein the block memory is divided into blocks, and each block is divided into pages, the method comprising transmitting data to the block memory page by page.

8. The method according to claim 7, comprising performing erasing of at least one block, and
setting a previously determined status as the status of all the memory cells of said at least one block.

9. The method according to claim 1, comprising examining the status of said ready/busy line, and
performing re-examination of the status of the ready/busy line when it changes from the busy status to the ready status.

10. The method according to claim 1, wherein the connection bus comprises a data bus comprising at least one data line, the method comprising using the data line of said data bus as a ready/busy line.

11. A system, comprising an electronic device comprising a block memory having memory cells for storing data, and a connection bus connected to said block memory,
wherein said connection bus comprises at least a ready/busy line capable of indicating
at least a ready status and a busy status, and
wherein said block memory comprises
means for changing the status of said ready/busy line to said busy status in a beginning of a processing function of the block memory,
a comparator for detecting processing errors,
means for indicating the end of processing function by setting said ready/busy line to said ready status, and
means for changing the status of said ready/busy line back to said busy status after detecting a processing error.

12. The system according to claim 11, wherein said processing function is one of the following:

emptying the memory cells,
storing data in the memory cells,
copying data between the memory cells,
reading data stored in the memory cells.

13. The system according to claim 11, comprising a processor, and a first connection bus between the processor and the block memory, and means for starting the processing function by sending a command to the block memory, and means for setting the status of said ready/busy line to the busy status when the function according to the command has been started in the block memory.

14. The system according to claim 13, comprising means for creating an interrupt in the processor when the status of the ready/busy line changes from the busy status to the ready status, and the processor comprising means for examining the status of the ready/busy line in connection with handling the interrupt.

15. The system according to claim 11, comprising a processor, a memory controller, a first connection bus between the processor and the memory controller, and a second connection bus between the memory controller and the block memory, in which case the commands are arranged to be sent from the processor to the memory controller, as well as from the memory controller to the block memory, the system comprising means for starting storing of the data by sending a command to the block memory, and means for setting the status of said ready/busy line to the busy status when the function according to the command has been started in the block memory.

16. The system according to claim 15, comprising means for creating an interrupt in the memory controller when the status of the ready/busy line changes from the busy status to the ready status, wherein the memory controller comprises means for examining the status of the ready/busy line in connection with handling the interrupt, and means for forming an interrupt to the processor if the ready/busy line is in the busy status.

17. The system according to claim 11, wherein the block memory is divided into blocks, and each block is divided into pages, the system comprising means for transmitting data to the block memory page by page.

18. The system according to claim 11, the bus interface comprising a data bus comprising at least one data line, and that the data line of said data bus is arranged to be used as a ready/busy line.

19. An electronic device, comprising a block memory having memory cells for storing data, and a bus interface connected to said block memory,
wherein said connection bus comprises at least a ready/busy line capable of indicating at least a ready status and a busy status, and wherein said block memory comprises means for setting the status of said ready/busy line to said busy status in a beginning of a processing function of the block memory, a comparator for detecting processing errors, means for indicating an end of the processing function by setting said ready/busy line to said ready status, and means for changing the status of said ready/busy line back to said busy status after detecting a processing error.

20. A block memory, comprising memory cells for storing data, and a connection bus comprising at least a ready/busy line, capable of indicating at least a ready status and a busy status wherein said block memory further comprises means for setting the status of said ready/busy line to said busy status in a beginning of a processing function of the block memory, a comparator for detecting processing errors, means for indicating an end of processing function by setting said ready/busy line to said ready status, and means for changing the status of said ready/busy line back to said busy status after detecting a processing error.

21. The memory block according to claim 20, wherein said processing function is one of the following:

emptying the memory cells, storing data in the memory cells, copying data between the memory cells, and reading data stored in the memory cells.

22. The block memory according to claim 20, comprising a comparator for comparing the data stored in the memory cells with data meant to be stored in order to detect storing errors.

* * * * *